(12) United States Patent
Lim

(10) Patent No.: US 9,323,257 B2
(45) Date of Patent: Apr. 26, 2016

(54) VOLTAGE CONVERSION CIRCUIT, SEMICONDUCTOR MEMORY APPARATUS HAVING THE SAME, AND OPERATING METHOD

(71) Applicant: SK hynix Inc., Icheon-si Gyeonggi-do (KR)

(72) Inventor: Sang Oh Lim, Icheon-si Gyeonggi-do (KR)

(73) Assignee: SK hynix Inc., Icheon-si, Gyeonggi-do (KR)

( * ) Notice: Subject to any disclaimer, the term of this patent is extended or adjusted under 35 U.S.C. 154(b) by 0 days.

(21) Appl. No.: 14/573,442

(22) Filed: Dec. 17, 2014

(65) Prior Publication Data

US 2016/0085249 A1 Mar. 24, 2016

(30) Foreign Application Priority Data

Sep. 23, 2014 (KR) .................. 10-2014-0126958

(51) Int. Cl.
 *G11C 5/14* (2006.01)
 *G05F 1/10* (2006.01)
 *G11C 16/30* (2006.01)

(52) U.S. Cl.
 CPC *G05F 1/10* (2013.01); *G11C 5/147* (2013.01); *G11C 16/30* (2013.01)

(58) Field of Classification Search
 CPC .................................. G11C 5/147; G11C 7/14
 USPC ..................................... 365/189.09, 226, 227
 See application file for complete search history.

(56) References Cited

U.S. PATENT DOCUMENTS

2004/0155636 A1* 8/2004 Fukui .................. G05F 1/56
 323/281

FOREIGN PATENT DOCUMENTS

KR 1020040006416 A 1/2004
KR 1020050047911 A 5/2005

* cited by examiner

*Primary Examiner* — Han Yang
(74) *Attorney, Agent, or Firm* — William Park & Associates Ltd.

(57) ABSTRACT

A voltage conversion circuit may include a first reference voltage generation block configured to be provided with an external voltage, and generate a first reference voltage; a second reference voltage generation block configured to be provided with the external voltage and generate a second reference voltage according to a standby trim code; a trim code generation block configured to generate the standby trim code according to levels of the first reference voltage and the second reference voltage; and an internal voltage generation block configured to select the first reference voltage or the second reference voltage as a determined reference voltage according to an operation mode of a semiconductor memory apparatus, and to generate an internal voltage from the external voltage.

20 Claims, 8 Drawing Sheets

VOLTAGE CONVERSION CIRCUIT, SEMICONDUCTOR MEMORY APPARATUS HAVING THE SAME, AND OPERATING METHOD

CROSS-REFERENCES TO RELATED APPLICATION

The present application claims priority under 35 U.S.C. §119(a) to Korean application number 10-2014-0126958, filed on Sep. 23, 2014, in the Korean Intellectual Property Office, which is incorporated herein by reference in its entirety.

BACKGROUND

1. Technical Field

Various embodiments generally relate to a semiconductor apparatus, and more particularly, to a voltage conversion circuit, a semiconductor memory apparatus having the same, and an operating method.

2. Related Art

A semiconductor memory apparatus may operate with a voltage of a level different from the level of a voltage inputted from an exterior. For example, a low power electronic appliance such as a portable electronic appliance is designed to use low power to maximally increase the duration of a battery.

Accordingly, a semiconductor memory apparatus may include a voltage conversion circuit for converting an external voltage into a voltage of a desired level in conformity with the characteristic of an appliance to which the semiconductor memory apparatus is applied.

The reason why the different reference voltages are used in the active mode and the standby mode is to reduce standby current. Further, only when an internal voltage generated based on a second reference voltage in a standby mode and the internal voltage generated based on a first reference voltage in an active mode are generated in such a way as to have substantially the same level, the semiconductor memory apparatus may reliably perform an operation.

SUMMARY

In an embodiment, a voltage conversion circuit may include a first reference voltage generation block configured to be provided with an external voltage, and generate a first reference voltage. The voltage conversion unit may also include a second reference voltage generation block configured to be provided with the external voltage and generate a second reference voltage according to a standby trim code. Further, the voltage conversion unit may include a trim code generation block configured to generate the standby trim code according to levels of the first reference voltage and the second reference voltage. In addition, the voltage conversion unit may include an internal voltage generation block configured to select the first reference voltage or the second reference voltage as a determined reference voltage according to an operation mode of a semiconductor memory apparatus, and to generate an internal voltage from the external voltage.

In an embodiment, a semiconductor memory apparatus may include a voltage conversion circuit configured to trim a level of a second reference voltage based on a level of a first reference voltage, select the first reference voltage or the second reference voltage as a determined reference voltage according to an operation mode, and generate an internal voltage from an external voltage. The semiconductor memory apparatus may also include at least one memory chip configured to operate according to the internal voltage.

In an embodiment, a method for operating a semiconductor memory apparatus may include powering up the semiconductor memory apparatus, and transitioning the semiconductor memory apparatus to an active mode. The method may also include generating an internal voltage from an external voltage according to a first reference voltage, and trimming a level of a second reference voltage according to a level of the first reference voltage. Further, the method may include transitioning the semiconductor memory apparatus to a standby mode. In addition, the method may include generating the internal voltage from the external voltage according to the trimmed second reference voltage.

DETAILED DESCRIPTION

Hereinafter, a voltage conversion circuit, a semiconductor memory apparatus having the same, and an operating method will be described below with reference to accompanying figures through various embodiments.

Figure 1:
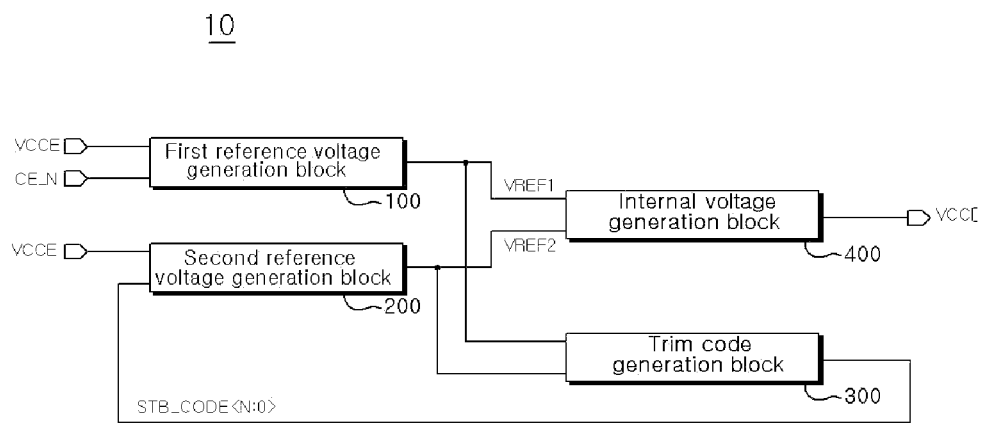
FIG. 1 is a configuration diagram illustrating a representation of an example of a voltage conversion circuit in accordance with an embodiment.

Referring to FIG. 1, a configuration diagram illustrating a representation of an example of a voltage conversion circuit in accordance with an embodiment is described.

A voltage conversion circuit 10 in accordance with an embodiment may include a first reference voltage generation block 100, a second reference voltage generation block 200, a trim code generation block 300, and an internal voltage generation block 400.

The first reference voltage generation block 100 may be applied with an external voltage VCCE. The first reference voltage generation block 100 may generate a first reference voltage VREF1 in response to a chip enable signal CE_N. The first reference voltage VREF1 may be a reference voltage used to generate an internal voltage in an active mode. The first reference voltage generation block 100 may be configured by a circuit which is ensured in its stability against a variation in PVT (process, voltage and temperature). The first reference voltage generation block 1000 may output the first reference voltage VREF1 of a preset level regardless of a change in the external voltage VCCE.

The second reference voltage generation block 200 may be applied with the external voltage VCCE. The second reference voltage generation block 200 may generate a second reference voltage VREF2 in response to a standby trim code STB_CODE<N:0>. The second reference voltage VREF2 may be a reference voltage used to generate an internal voltage in a standby mode. The consumption of only a minimum amount of current is allowed in the standby mode. The second reference voltage generation block 200 may be configured by a circuit which has a quick response time and a small current consumption characteristic.

The trim code generation block 300 may generate the standby trim code STB_CODE<N:0> based on the levels of the first reference voltage VREF1 and the second reference voltage VREF2. The standby trim code STB_CODE<N:0> may be determined such that the level of the second reference voltage VREF2 becomes substantially the same as the level of the first reference voltage VREF1.

The internal voltage generation block 400 receives the first reference voltage VREF1 and the second reference voltage VREF2. The internal voltage generation block 400 may generate an internal voltage VCCI by using any one of the first reference voltage VREF1 and the second reference voltage VREF2 as a determined reference voltage VREF according to the operation mode of a semiconductor memory apparatus. For example, the first reference voltage VREF1 may be used as the determined reference voltage VREF in the active mode. The second reference voltage VREF2 may be used as the determined reference voltage VREF in the standby mode.

In an embodiment, the trim code generation block 300 generates the standby trim code STB_CODE<N:0> based on the level of the first reference voltage VREF1. Accordingly, the second reference voltage generation block 200 may generate the second reference voltage VREF2 according to the standby trim code STB_CODE<N:0> determined according to the level of the first reference voltage VREF1. As a result, the first reference voltage VREF1 and the second reference voltage VREF2 may become similar or have substantially the same levels.

When the transition is made from the active mode to the standby mode or vice versa, if there is a difference between the levels of the two reference voltages VREF1 and VREF2, a change may occur in the level of the internal voltage VCCI. Accordingly, a malfunction of a chip may result. In an embodiment, since the levels of the two reference voltages VREF1 and VREF2 are controlled to be substantially the same or similar, the operational reliability of the semiconductor memory apparatus may be ensured.

Figure 2:
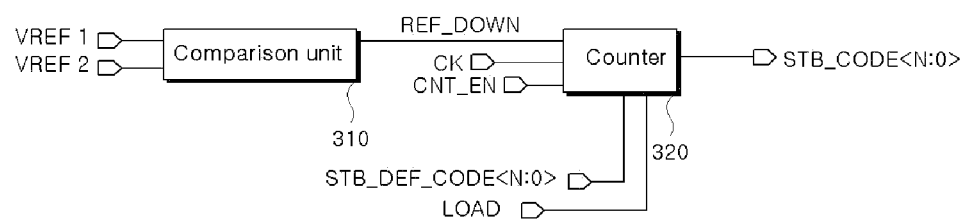
FIG. 2 is a configuration diagram illustrating a representation of an example of a trim code generation block in accordance with an embodiment.

Referring to FIG. 2, a configuration diagram illustrating a representation of an example of a trim code generation block in accordance with an embodiment is described.

A trim code generation block 300-1 in accordance with an embodiment may include a comparison unit 310 and a counter 320.

The comparison unit 310 may receive and compare the first reference voltage VREF1 and the second reference voltage VREF2. The comparison unit 310 may generate a count control signal REF_DOWN as a comparison result.

A default code STB_DEF_CODE<N:0> is initially loaded on the counter 320 according to a loading signal LOAD. As the counter 320 is driven in response to a count enable signal CNT_EN, the counter 320 may count the default code STB_DEF_CODE<N:0> based on the count control signal REF_DOWN in synchronization with a clock signal CK. Further, the counter 320 may generate the standby trim code STB_CODE<N:0>. The clock signal CK may be a clock signal for a processor disposed in a device to which the semiconductor memory apparatus is applied.

For example, if the level of the second reference voltage VREF2 is higher than the level of the first reference voltage VREF1, the count control signal REF_DOWN is generated to down-count the default code STB_DEF_CODE<N:0>. The standby trim code STB_CODE<N:0> generated by down-counting the default code STB_DEF_CODE<N:0> is provided to the second reference voltage generation block 200 and is used to lower the level of the second reference voltage VREF2. If the levels of the first reference voltage VREF1 and the second reference voltage VREF2 become substantially the same with or similar to each other through this process, the standby trim code STB_CODE<N:0> repeatedly outputs two successive code values. Moreover, the operation of the trim code generation block 300 is disabled.

If the level of the second reference voltage VREF2 is lower than the level of the first reference voltage VREF1, the count control signal REF_DOWN is generated to up-count the default code STB_DEF_CODE<N:0>. The standby trim code STB_CODE<N:0> generated by up-counting the default code STB_DEF_CODE<N:0> is provided to the second reference voltage generation block 200 and is used to raise the level of the second reference voltage VREF2. If the levels of the first reference voltage VREF1 and the second reference voltage VREF2 become substantially the same with or similar to each other through this process, the standby trim code STB_CODE<N:0> repeatedly outputs two successive code values. In addition, the operation of the trim code generation block 300 is disabled.

In an embodiment, the trim code generation block 300 may be disabled by turning off the comparison unit 310 after operating the comparison unit 310 for a preset time. In an embodiment, the trim code generation block 300 may be disabled by disabling the count enable signal CNT_EN when it is sensed that the standby trim code STB_CODE<N:0> outputted from the counter 320 repeatedly outputs two successive code values.

It is to be noted that, as a matter of course, various methods known in the art may be used to enable and disable the trim code generation block 300.

As described above, the level of the second reference voltage VREF2 may be trimmed based on the level of the first reference voltage VREF1.

One of the first reference voltage VREF1 and the second reference voltage VREF2 is selected as the determined reference voltage VREF according to the operation mode of the semiconductor memory apparatus and is used in generating the internal voltage VCCI.

Figure 3:
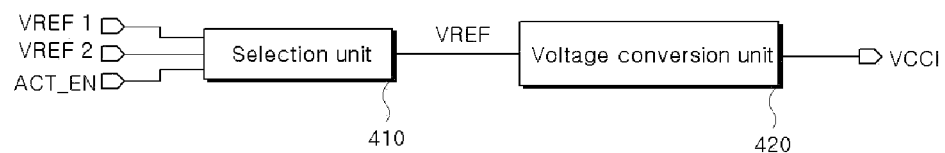
FIG. 3 is a configuration diagram illustrating a representation of an example of an internal voltage generation block in accordance with an embodiment.

Referring to FIG. 3, a configuration diagram illustrating a representation of an example of an internal voltage generation block 400-1 in accordance with an embodiment is described.

In an embodiment, the internal voltage generation block 400-1 may include a selection unit 410 and a voltage conversion unit 420.

The selection unit 410 selects one of the first reference voltage VREF1 and the second reference voltage VREF2 in response to an active mode enable signal ACT_EN. The selection unit 410 outputs the determined reference voltage VREF. In an embodiment, the first reference voltage VREF1 may be outputted as the determined reference voltage VREF when the active mode enable signal ACT_EN is enabled. The second reference voltage VREF2 may be outputted as the determined reference voltage VREF when the active mode enable signal ACT_EN is disabled, that is, it becomes the standby mode.

The voltage conversion unit 420 is provided with the determined reference voltage VREF, converts the level of the external voltage VCCE, and outputs the internal voltage VCCI.

Figure 4:
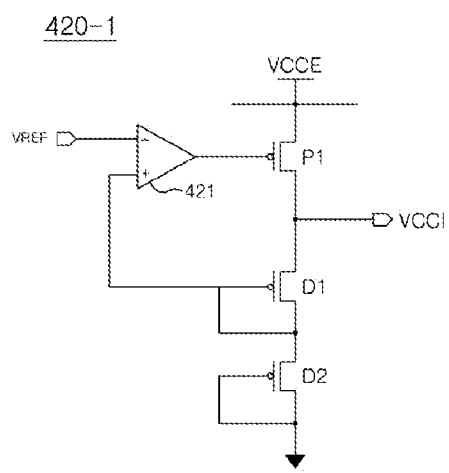
FIG. 4 is a configuration diagram illustrating a representation of an example of a voltage conversion unit in accordance with an embodiment.

Referring to FIG. 4, a configuration diagram illustrating a representation of an example of a voltage conversion unit 420-1 in accordance with an embodiment is described.

A comparator 421 is provided with the determined reference voltage VREF through the first input terminal thereof. The comparator 421 is inputted with a feedback signal through the second input terminal. A transistor P1 is supplied with the external voltage VCCE, and is driven by the output signal of the comparator 421. First and second diodes D1 and D2 divide the external voltage VCCE supplied through the transistor P1. The output voltage of the first diode D1, as a divided voltage, may be provided to the comparator 421 as the feedback signal.

Accordingly, a voltage of which level is converted by the first and second diodes D1 and D2 via the transistor P1 may be outputted as the internal voltage VCCI.

The configuration of the voltage conversion unit 420-1 is not limited to such. Any circuits may be applied as a matter of course so long as they may output the external voltage VCCE as the internal voltage VCCI of a constant level by using the determined reference voltage VREF.

It was described above that the first reference voltage generation block 100 may be configured by a circuit ensured in its stability against a variation in PVT (process, voltage and temperature), to output the first reference voltage VREF1 of a preset level regardless of a change in the external voltage VCCE.

Figure 5:
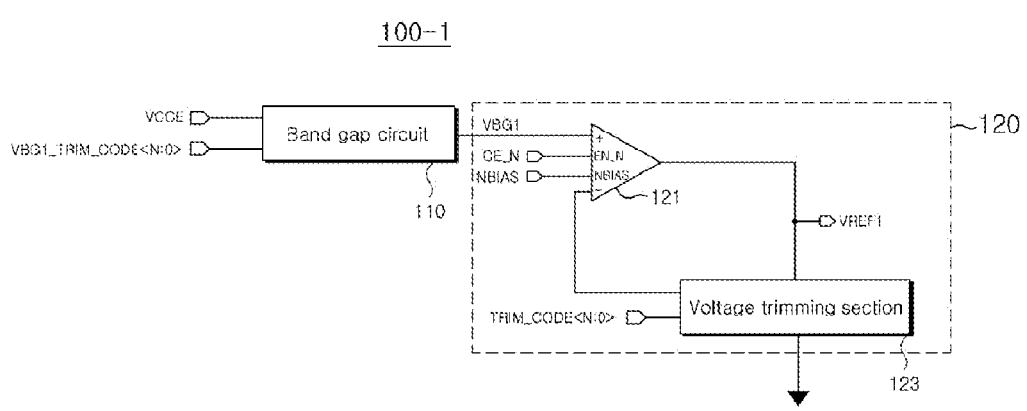
FIG. 5 is a configuration diagram illustrating a representation of an example of a first reference voltage generation block in accordance with an embodiment.

An example of a first reference voltage generation block 100-1 satisfying this is shown in FIG. 5 described below.

The first reference voltage generation block 100-1 may include a band gap circuit 110 and a voltage driver 120.

The band gap circuit 110 is applied with the external voltage VCCE. The band gap circuit 110 generates a band gap reference voltage VBG1 based on a band gap trim code VBG1_TRIM_CODE<N:0>.

The voltage driver 120 is provided with the band gap reference voltage VBG1 in response to the chip enable signal CE_N, and generates the first reference voltage VREF1. The first reference voltage VREF1 may be trimmed by an active trim code TRIM_CODE<N:0>. The trimmed first reference voltage VREF1 may be fed back to a comparator 121 such that a reference voltage of a preset level may be outputted.

The voltage driver 120 may include the comparator 121 and a voltage trimming section 123. The comparator 121 may be provided with a bias voltage NBIAS. The comparator 121 may be provided with the band gap reference voltage VBG1 and a feedback voltage in response to the chip enable signal CE_N. The comparator 121 may generate the first reference voltage VREF1.

The voltage trimming section 123 may trim the first reference voltage VREF1 by being provided with the active trim code TRIM_CODE<N:0>. The voltage trimming section 123 may transfer the feedback voltage as a trimming result to the comparator 121.

Since the first reference voltage generation block 100-1 using the band gap circuit 110 may generate the first reference voltage VREF1 of a preset level regardless of a change in the external voltage VCCE, the semiconductor memory apparatus may stably perform an operation in the active mode.

The configuration of the first reference voltage generation block 100 is not limited to such. Further, any circuits may be applied as a matter of course so long as they may generate the first reference voltage VREF1 of a preset level.

Figure 6:
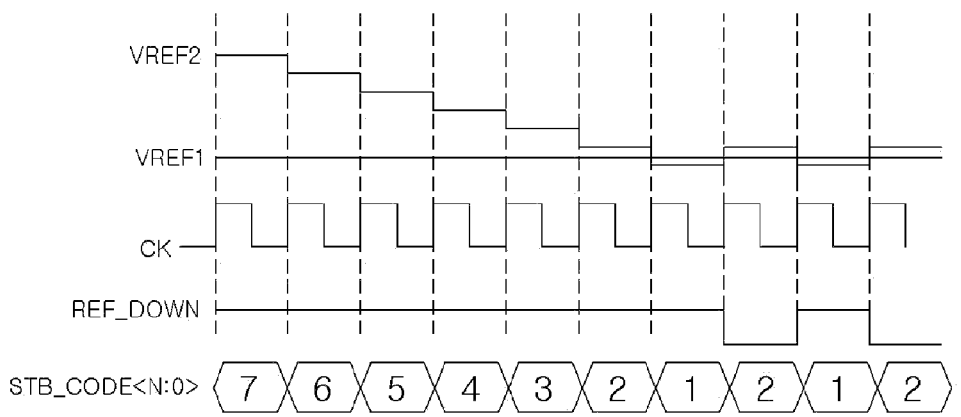
FIGS. 6 and 7 are representations of examples of timing diagrams to assist in the explanation of an operation method of the voltage conversion circuit in accordance with an embodiment.
Figure 7:
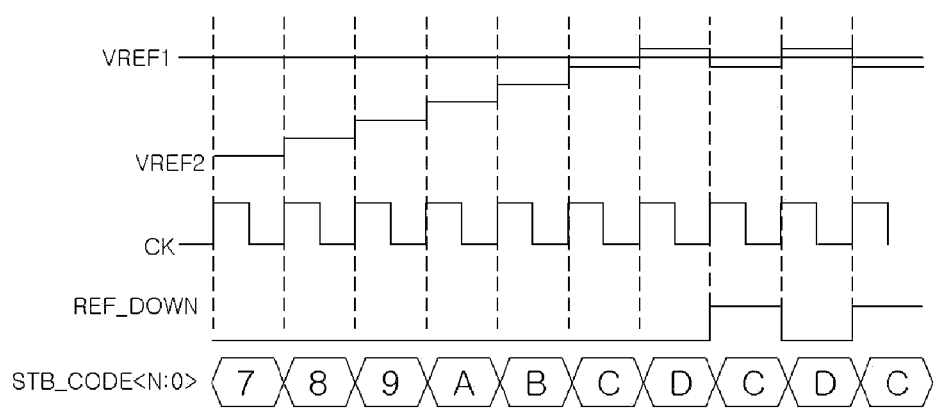

Referring to FIGS. 6 and 7, representations of examples of timing diagrams to assist in the explanation of an operation method of the voltage conversion circuit in accordance with an embodiment are described. Descriptions will be made with reference back to FIG. 2.

FIG. 6 is a timing diagram to assist in the explanation of operations when the level of the second reference voltage VREF2 is higher than the level of the first reference voltage VREF1.

In this case, the count control signal REF_DOWN outputted from the comparison unit 310 may be outputted at, for example, a high level, such that the default code STB_DEF_CODE<N:0> previously loaded may be down-counted. The counter 320 down-counts the default code STB_DEF_CODE<N:0> according to the count control signal REF_DOWN and the clock signal CK. In addition, the counter 320 outputs the standby trim code STB_CODE<N:0>.

The standby trim code STB_CODE<N:0> is provided to the second reference voltage generation block 200 and is used to lower the level of the second reference voltage VREF2. If the levels of the first reference voltage VREF1 and the second reference voltage VREF2 become substantially the same with or similar to each other through this process, the standby trim code STB_CODE<N:0> repeatedly outputs two successive code values. Further, the operation of the trim code generation block 300 is disabled.

The second reference voltage generation block 200 may generate the second reference voltage VREF2 by the last standby trim code STB_CODE<N:0>.

FIG. 7 is a timing diagram to assist in the explanation of operations when the level of the second reference voltage VREF2 is lower than the level of the first reference voltage VREF1.

In this case, the count control signal REF_DOWN outputted from the comparison unit 310 may be outputted at, for example, a low level, such that the default code STB_DEF_CODE<N:0> previously loaded may be up-counted. The counter 320 up-counts the default code STB_DEF_CODE<N:0> according to the count control signal REF_DOWN and the clock signal CK. The counter 320 also outputs the standby trim code STB_CODE<N:0>.

The standby trim code STB_CODE<N:0> is provided to the second reference voltage generation block 200 and is used to raise the level of the second reference voltage VREF2. If the levels of the first reference voltage VREF1 and the second reference voltage VREF2 become substantially the same with or similar to each other through this process, the standby trim code STB_CODE<N:0> repeatedly outputs two successive code values. In addition, the operation of the trim code generation block 300 is disabled.

The second reference voltage generation block 200 may generate the second reference voltage VREF2 by the last standby trim code STB_CODE<N:0>.

In a semiconductor memory apparatus, after power is applied, loading of various fuse values is implemented in an active mode, and then, transition may be made to a standby mode. A second reference voltage used in generating an internal voltage in the standby mode may be set in advance in the active mode before transition is made to the standby mode. This will be described below with reference to FIGS. 8 and 9.

Figure 8:
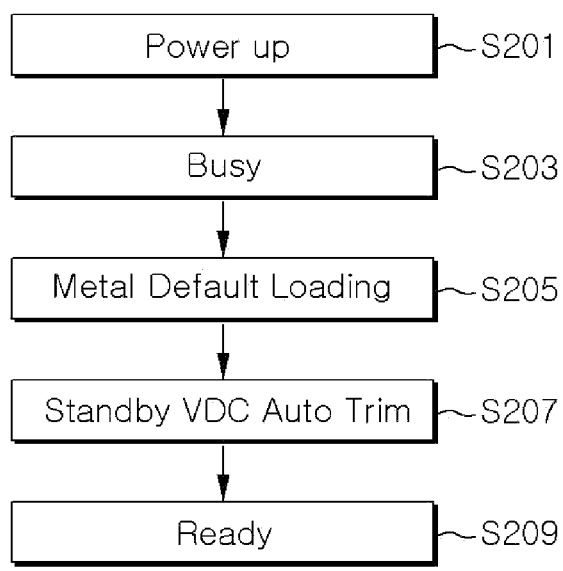
FIGS. 8 and 9 are representations of examples of flow charts to assist in the explanation of operation methods of a semiconductor memory apparatus in accordance with embodiments.

Referring to FIG. 8, a representation of an example of a flow chart to assist in the explanation of an operation method of a semiconductor memory apparatus in accordance with an embodiment is described.

First, as power is supplied to the semiconductor memory apparatus, power-up is implemented (S201). Then, as the chip enable signal CE_N is enabled, the semiconductor memory apparatus transitions to the active mode and becomes a busy state (S203). Metal default values to set the states of various fuses are loaded (S205). Thereafter, in the state in which the active mode is retained, a trimming process to generate the second reference voltage VREF2 to be used in generating an internal voltage in the standby mode may be performed (S207).

The trimming process to generate the second reference voltage VREF2 may be a process to generate the standby trim code STB_CODE<N:0> which causes the level of the second reference voltage VREF2 to be substantially the same as or similar to the level of the first reference voltage VREF1 according to a comparison result of the first reference voltage VREF1 and the second reference voltage VREF2. More specifically, when the level of the second reference voltage VREF2 is higher than the level of the first reference voltage VREF1, the standby trim code STB_CODE<N:0> may be sequentially down-counted until the level of the second reference voltage VREF2 becomes substantially the same as or similar to the level of the first reference voltage VREF1. When the level of the second reference voltage VREF2 is lower than the level of the first reference voltage VREF1, the standby trim code STB_CODE<N:0> may be sequentially up-counted until the level of the second reference voltage VREF2 becomes substantially the same as or similar to the level of the first reference voltage VREF1.

After the trimming process to generate the second reference voltage VREF2 is performed in the active mode, the semiconductor memory apparatus is converted into a ready state and transitions to the standby mode (S209). The second reference voltage VREF2 may be generated based on the standby trim code STB_CODE<N:0> previously generated in the step S207, and the internal voltage VCCI may be generated based thereon.

Figure 9:
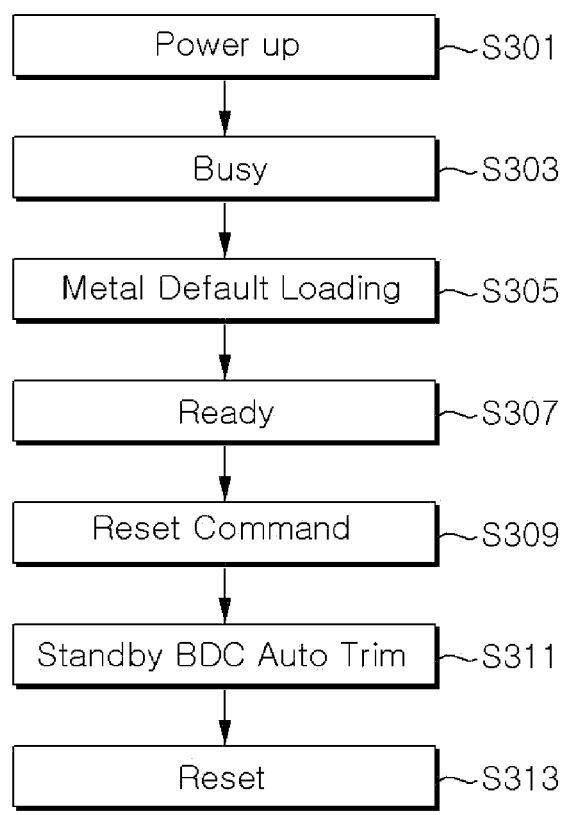

Referring to FIG. 9, a representation of an example of a flow chart to assist in the explanation of an operation method of a semiconductor memory apparatus in accordance with an embodiment is described.

A semiconductor memory apparatus does not operate before a reset signal is applied after it becomes the ready state. Therefore, if a reset command is inputted, a trimming process to generate the second reference voltage VREF2 to be used in generating an internal voltage in the standby mode may be performed before a reset operation is performed.

Figure 10:
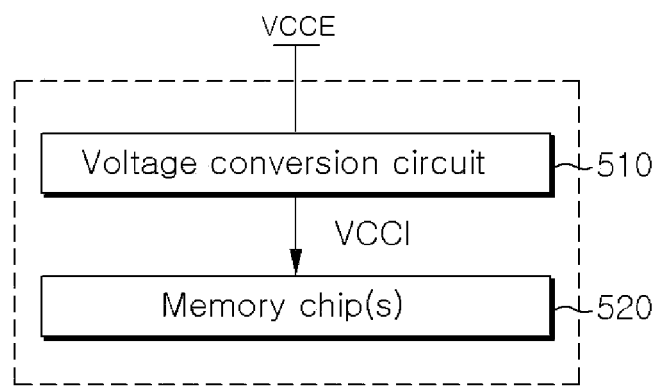
FIG. 10 is a configuration diagram illustrating a representation of an example of a semiconductor memory apparatus in accordance with an embodiment.

Referring to FIG. 10, a power-up process (S301), a conversion process into a busy state (S303) and a loading process of metal default values (S305) are performed in the same manner as in FIG. 9, and thereafter, the semiconductor memory apparatus becoming a ready state (S307) are illustrated.

Then, if a reset command is inputted (S309), a trimming process (S311) to generate the second reference voltage VREF2 to be used in generating an internal voltage in the standby mode is performed. Further, a reset operation is performed (S313).

As described above with reference to FIG. 9, the trimming process (S311) may be a process to generate the standby trim code STB_CODE<N:0> which causes the level of the second reference voltage VREF2 to be substantially the same as or similar to the level of the first reference voltage VREF1 according to a comparison result of the first reference voltage VREF1 and the second reference voltage VREF2.

FIG. 10 is a configuration diagram illustrating a representation of an example of a semiconductor memory apparatus in accordance with an embodiment.

A semiconductor memory apparatus 50 in accordance with an embodiment may include a voltage conversion circuit 510 provided with an external voltage VCCE and outputs an internal voltage VCCI of a predetermined level. The semiconductor memory apparatus 50 may also include at least one memory chip 520 which operates according to the internal voltage VCCI provided from the voltage conversion circuit 510.

The memory chip 520 may be a memory chip configured by using a nonvolatile memory chip, for example, but not limited to, a flash memory device.

The voltage conversion circuit 510 may be configured by a circuit which trims the level of a second reference voltage VREF2 based on the level of a first reference voltage VREF1 during an active mode. The voltage conversion circuit 510 generates the internal voltage VCCI according to the first reference voltage VREF1 in the active mode and generates the internal voltage VCCI according to the trimmed second reference voltage VREF2 in a standby mode.

For example, the voltage conversion circuit 510 may be configured using, but not limited to, the voltage conversion circuit shown in FIG. 1.

Figure 11:
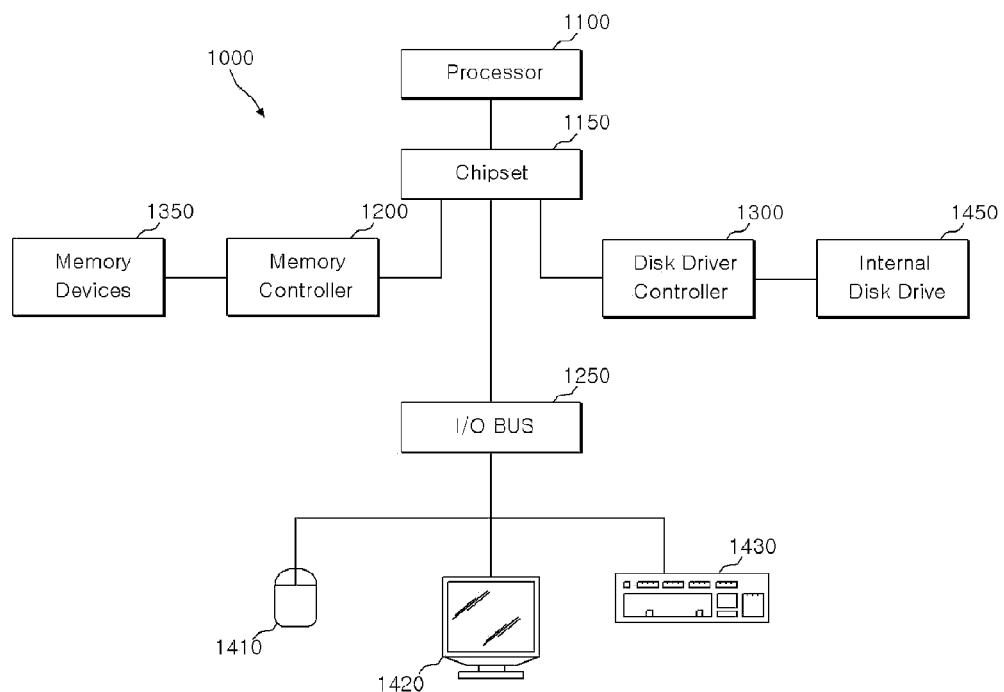
FIG. 11 illustrates a block diagram of a system employing a memory controller circuit in accordance with embodiments of the invention.

Referring to FIG. 11, a system 1000 including one or more processors 1100 is illustrated. The processor 1100 may be used individually or in combination with other processors. A chipset 1150 may be electrically coupled to the processor 1100. The chipset 1150 is a communication pathway for signals between the processor 1100 and other components of the system 1000. Other components of the system 1000 may include a memory controller 1200, an input/output ("I/O") bus 1250, and a disk drive controller 1300. Depending on the configuration of the system 1000, any one of a number of different signals may be transmitted through the chipset 1150.

The memory controller 1200 may be electrically coupled to the chipset 1150. The memory controller 1200 can receive a request provided from the processor 1100 through the chipset 1150. The memory controller 1200 may be electrically coupled to one or more memory devices 1350. The memory devices 1350 may include the semiconductor memory apparatus described above.

The chipset 1150 may also be electrically coupled to the I/O bus 1250. The I/O bus 1250 may serve as a communication pathway for signals from the chipset 1150 to I/O devices 1410, 1420 and 1430. The I/O devices 1410, 1420 and 1430 may include a mouse 1410, a video display 1420, or a keyboard 1430. The I/O bus 1250 may employ any one of a number communications protocols to communicate with the I/O devices 1410, 1420 and 1430.

The disk drive controller 1300 may also be electrically coupled to the chipset 1150. The disk drive controller 1300 may serve as the communication pathway between the chipset 1150 and one or more internal disk drives 1450. The disk drive controller 1300 and the internal disk drives 1450 may communicate with each other or with the chipset using virtually any type of communication protocol.

While various embodiments have been described above, it will be understood to those skilled in the art that the embodiments described are by way of example only. Accordingly, the voltage conversion circuit, the semiconductor memory apparatus having the same, and the operating method described should not be limited based on the described embodiments.

What is claimed is:

1. A voltage conversion circuit comprising:
a first reference voltage generation block configured to be provided with an external voltage and generate a first reference voltage;
a second reference voltage generation block configured to be provided with the external voltage and generate a second reference voltage according to a standby trim code;
a trim code generation block configured to generate the standby trim code based on levels of the first reference voltage and the second reference voltage; and
an internal voltage generation block configured to select the first reference voltage or the second reference voltage as a determined reference voltage according to an operation mode of a semiconductor memory apparatus, and to generate an internal voltage from the external voltage.

2. The voltage conversion circuit according to claim 1, wherein the standby trim code is determined to allow the level of the second reference voltage to become substantially the same level as the level of the first reference voltage.

3. The voltage conversion circuit according to claim 1, wherein the internal voltage generation block selects the first reference voltage as the determined reference voltage when the semiconductor memory apparatus is in an active mode.

4. The voltage conversion circuit according to claim 1, wherein the internal voltage generation block selects the second reference voltage as the determined reference voltage when the semiconductor memory apparatus is in a standby mode.

5. The voltage conversion circuit according to claim 1, wherein the trim code generation block comprises:
a comparison unit configured to compare the first reference voltage and the second reference voltage and generate a count control signal; and
a counter configured to be loaded with a default code, count the default code based on the count control signal, and generate the standby trim code.

6. The voltage conversion circuit according to claim 5, wherein the counter down-counts the default code in response to the count control signal when the level of the second reference voltage is higher than the level of the first reference voltage.

7. The voltage conversion circuit according to claim 5, wherein the counter up-counts the default code in response to the count control signal when the level of the second reference voltage is lower than the level of the first reference voltage.

8. The voltage conversion circuit according to claim 5, wherein the trim code generation block is disabled when the level of the second reference voltage becomes substantially the same level as the level of the first reference voltage.

9. The voltage conversion circuit according to claim 1, wherein the first reference voltage generation block includes a band gap circuit.

10. A semiconductor memory apparatus comprising:
a voltage conversion circuit configured to trim a level of a second reference voltage based on a level of a first reference voltage, select the first reference voltage or the second reference voltage as a determined reference voltage according to an operation mode, and generate an internal voltage from an external voltage; and
at least one memory chip configured to operate according to the internal voltage.

11. The semiconductor memory apparatus according to claim 10, wherein the voltage conversion circuit comprises:
a first reference voltage generation block configured to be provided with the external voltage, and generate the first reference voltage;
a second reference voltage generation block configured to be provided with the external voltage and generate the second reference voltage according to a standby trim code;
a trim code generation block configured to generate the standby trim code based on the levels of the first reference voltage and the second reference voltage; and
an internal voltage generation block configured to select the first reference voltage or the second reference voltage as the determined reference voltage according to the operation mode, and generate the internal voltage from the external voltage.

12. The semiconductor memory apparatus according to claim 10, wherein the standby trim code is determined to enable the level of the second reference voltage to become substantially the same level as the level of the first reference voltage.

13. The semiconductor memory apparatus according to claim 10, wherein the internal voltage generation block selects the first reference voltage as the determined reference voltage in the case where the semiconductor memory apparatus is in an active mode.

14. The semiconductor memory apparatus according to claim 10, wherein the internal voltage generation block selects the second reference voltage as the determined reference voltage in the case where the semiconductor memory apparatus is in a standby mode.

15. The semiconductor memory apparatus according to claim 10, wherein the trim code generation block comprises:
a comparison unit configured to compare the first reference voltage and the second reference voltage, and generate a count control signal; and
a counter configured to be loaded with a default code, count the default code based on the count control signal, and generate the standby trim code.

16. The semiconductor memory apparatus according to claim 10, wherein the first reference voltage generation block comprises a band gap circuit.

17. The semiconductor memory apparatus according to claim 10, wherein the memory chip includes a flash memory device.

18. A method for operating a semiconductor memory apparatus, comprising:
powering up the semiconductor memory apparatus, and transitioning the semiconductor memory apparatus to an active mode;
generating an internal voltage from an external voltage according to a first reference voltage, and trimming a level of a second reference voltage based on a level of the first reference voltage;
transitioning the semiconductor memory apparatus to a standby mode; and
generating the internal voltage from the external voltage according to the trimmed second reference voltage.

19. The method according to claim 18, wherein the trimming of the level of the second reference voltage enables the level of the second reference voltage to become substantially the same level as the level of the first reference voltage according to a result of comparing the first reference voltage and the second reference voltage.

20. The method according to claim 18, wherein the semiconductor memory apparatus is in a ready state after being transitioned to the active mode, and the trimming of the level of the second reference voltage is performed as a reset command is inputted in the ready state.

* * * * *